United States Patent

Ardenkjaer-Larsen

[11] Patent Number: 6,108,574
[45] Date of Patent: Aug. 22, 2000

[54] OVERHAUSER ENHANCED MAGNETIC RESONANCE IMAGING TECHNIQUE (OMRI OR PEDRI OR ESREMRI)

[75] Inventor: Jan Henrik Ardenkjaer-Larsen, Vanløse, Denmark

[73] Assignee: Nycomed Imaging AS, Oslo, Norway

[21] Appl. No.: 09/047,382

[22] Filed: Mar. 25, 1998

[30] Foreign Application Priority Data

Mar. 26, 1997 [GB] United Kingdom ............... 9706282

[51] Int. Cl.⁷ .................................................. A61B 5/05
[52] U.S. Cl. ................................................... 600/420
[58] Field of Search .................................. 600/407, 409, 600/410, 412, 414, 420, 436; 514/9, 11, 15; 324/309; 424/9.3

[56] References Cited

U.S. PATENT DOCUMENTS 5,325,854  7/1994  Ehnholm ................................. 600/420
5,479,925  1/1996  Dumoulin et al. .
5,617,859  4/1997  Souza et al. ............................ 600/420

FOREIGN PATENT DOCUMENTS

WO 98 01766  1/1988  European Pat. Off. .
0 296 833  12/1988  European Pat. Off. .

OTHER PUBLICATIONS

Wagshul M.E. et al., "In vivo MR imaging and spectroscopy using hyperpolarized/sup 129/Xe", 1996, Magnetic Resonance in Medicine, Williams & Wilkins, USA, XP002070307.
Research Disclosure, Apr. 1993, XP002070308.
D.M. Grant et al., "Encyclopedia of Nuclear Magnetic Resonance", 1996, John Wiley & Sons, Chichester, XP002070309, D.J. Lurie: "Imaging using the Electronic Overhauser Effect".

Primary Examiner—Marvin M. Lateef
Assistant Examiner—Ali M. Imam
Attorney, Agent, or Firm—Bacon & Thomas

[57] ABSTRACT

This invention provides a method of magnetic resonance investigation of an animate subject comprising ex vivo polarization of an MR imaging agent, characterized in that the MR imaging agent is heated during polarization or is at elevated temperature at the time of polarization.

16 Claims, 4 Drawing Sheets

OVERHAUSER ENHANCED MAGNETIC RESONANCE IMAGING TECHNIQUE (OMRI OR PEDRI OR ESREMRI)

This invention relates to a method of dynamic nuclear polarisation enhanced magnetic resonance imaging.

Magnetic resonance imaging (MRI) is a diagnostic technique that has become particularly attractive to physicians as it is non-invasive and does not involve exposing the patient under study to potentially harmful radiation such as X-rays.

The thermal equilibrium magnetisation of a sample of nuclear spin I in a magnetic field $B_0$ is given by the Boltzmann distribution:

$$M_0 = \gamma_I^2 \hbar N_s \frac{\sum_{m=1}^{I} m \exp(m \gamma_I^2 \hbar B_0 / k_B T)}{\sum_{m=1}^{I} \exp(\gamma_I^2 \hbar B_0 / k_B T)} \quad (1)$$

where $\gamma_I$ is the magnetogyric factor of the nucleus, $N_S$ is the number of spins per unit volume and T is the temperature of the sample. The population difference between nuclear levels at room temperature is usually extremely small due to the low Zeeman energy of the nucleus and therefore according to the Curie law $$M_0 = \frac{\gamma_I^2 I(I+1) \hbar^2 B_0 N_s}{3 k_B T} \quad (2)$$

At typical fields of 1–1.5T the relative population differences are $\approx 10^{-5}$ and the MR signals obtained are of low amplitude.

Electron spin resonance enhanced MRI (referred to in earlier publications as ESREMRI, OMRI or PEDRI) is a method of dynamic nuclear polarisation enhanced MRI in which enhancement of the magnetic resonance signals from which images may be generated is achieved by virtue of the dynamic nuclear polarization (the Overhauser effect) that occurs on VHF stimulation of an ESR transition in a magnetic material in the subject under study. Magnetic resonance signal enhancement may be by a factor of a hundred or more thus allowing enhanced images to be generated rapidly and with relatively low primary magnetic fields.

In the basic in vivo OMRI technique, the imaging sequence involves initially irradiating a subject placed in a uniform magnetic field (the primary magnetic field, B.) with radiation, usually VHF radiation, of a frequency selected to excite a narrow linewidth ESR transition in an OMRI contrast agent which is in (eg. oxygen or melanin), or has been administered to (eg. a free radical), the subject. Dynamic nuclear polarization results in an increase in the population difference between the excited and ground nuclear spin states of nuclei which are responsible for the magnetic resonance signals. Since MR signal intensity is proportional to this population difference, the subsequent stages of each imaging sequence, performed essentially as in conventional MRI techniques, result in larger amplitude MR signals being detected.

The basic equation of dynamic nuclear polarisation is given by:

$$Enh = \frac{M_z}{M_{zo}} = 1 - \frac{\gamma_s}{\gamma_I} f k SAT \quad (3)$$

where $\gamma_S$ is the electron magnetogyric factor and SAT is the saturation degree of the electron spin resonance (which approaches unity as the excitation field is increased). The ratio between the magnetogyric factor of the electron and the proton is 658. f is the leakage factor and k is the coupling factor where:

$$f = \frac{r_1 c T_{10}}{1 + r_1 c T_{10}} \quad (4)$$

$$r_1 c = \frac{2}{15} \gamma_I^2 \gamma_s^2 \hbar^2 S(S+1) \{3 f(\omega_I^2 \tau) + 7 f(\omega_s^2 \tau)\} \quad (5)$$

$$k = \frac{5 \gamma_I^2 \gamma_s^2 \hbar^2 S(S+1) f(\omega_s^2 \tau)}{\gamma_I^2 \gamma_s^2 \hbar^2 S(S+1) \{3 f(\omega_I^2 \tau) + 7 f(\omega_s^2 \tau)\}} \quad (6)$$

where $T_{10}$ is the relaxation time of the pure solvent, $r_1$ is the relaxivity and c is the concentration of the free radical. $J(\omega,\tau)$ are spectral densities that depend on the relative motion of the two spins I and S. The correlation time, $$\tau = \frac{d^2}{D_I + D_S},$$

where d is the minimal distance of approach and $D_I$, $D_S$ are the absolute translational diffusion constants of the two spins.

OMRI techniques have been described by several authors, notably Leunbach, Lurie, Ettinger, Grücker, Ehnholm and Sepponen, for example in EP-A-296833, EP-A-361551, WO-A-90/13047, J. Mag. Reson. 76:366–370(1988), EP-A-302742, SMRM 9:619(1990), SMRM 6:24(1987), SMRM 7:1094(1988), SMRM 8:329(1989), U.S. Pat. No. 4,719,425, SMRM 8:816(1989), Mag. Reson. Med. 14:140–147 (1990), SMRM 9:617(1990), SMRM 9:612(1990), SMRM 9:121(1990), GB-A-2227095, DE-A-4042212 and GB-A-2220269.

One particular method of dynamic nuclear polarisation enhanced MRI relies on ex vivo dynamic nuclear polarisation of selected nuclei of an MR imaging agent by an OMRI contrast agent (eg. a free radical), the latter conveniently being disposed of prior to administration of the polarised MR imaging agent into the subject. This method is described in UK Patent Application No. 9614139.5 filed on Jul. 5, 1996 in the name of Nycomed Imaging AS. The present invention is based on the finding that dynamic nuclear polarisation can be formed at higher field strengths by increasing the temperature of the sample. Heating the MR imaging agent prior to or during ex vivo polarisation increases the $T_1$ relaxation time.

Thus viewed from one aspect the present invention provides a method of magnetic resonance investigation of a sample, preferably of a human or non-human animal body (eg. a mammalian, reptilian or avian body) comprising ex vivo polarisation eg. dynamic nuclear polarisation of an MR imaging agent characterised in that the MR imaging agent, preferably together with an OMRI contrast agent, is heated during or prior to polarisation.

Viewed from a further aspect the present invention provides a method of magnetic resonance investigation of an animate subject comprising ex vivo polarisation of an MR imaging agent, characterised in that the MR imaging agent, preferably together with an OMRI contrast agent, is heated during polarisation or is at elevated temperature at the time of polarisation.

In one particular embodiment, the method comprises:

(i) placing a composition comprising an OMRI contrast agent and an MR imaging agent in a uniform magnetic field (eg. the primary magnetic field $B_0$);

(ii) heating said composition;

(iii) exposing said composition to a first radiation of a frequency selected to excite electron spin transitions in said OMRI contrast agent;

(iv) separating the whole, substantially the whole, or a portion of said OMRI contrast agent from said MR imaging agent;

(v) cooling said MR imaging agent;

(vi) administering said MR imaging agent to said sample;

(vii) exposing said sample to a second radiation of a frequency selected to excite nuclear spin transitions in said MR imaging nuclei;

(viii) detecting magnetic resonance signals from said sample; and (ix) optionally, generating an image or dynamic flow data from said detected signals.

Conveniently, step (iii) may serve to provide the desired increase in temperature of the composition making step (ii) optional.

Thus in one embodiment the invention involves the sequential steps of heating an MR imaging agent, ex vivo dynamic nuclear polarisation of MR imaging nuclei, administration of cooled, polarised MR imaging nuclei in the absence of a portion of, preferably substantially the whole of, the OMRI contrast agent, and conventional in vivo MR signal generation and measurement. The MR signals obtained in this way may be conveniently converted into 2- or 3-dimensional image data or flow data. By MR imaging agent is meant an agent containing nuclei (MR imaging nuclei) capable of emitting magnetic resonance signals. Generally such nuclei will be protons, preferably water protons; however, other non-zero nuclear spin nuclei may be used (eg. F or Li nuclei) and in this event the signals from which the image is generated will be substantially only from the MR imaging agent itself.

In a further embodiment, ex vivo polarisation may be achieved in the absence of an OMRI contrast agent by imposing a field higher than $B_0$. Thus the method involves the sequential steps of heating an MR imaging agent such as a physiologically tolerable aqueous fluid, ex vivo polarisation using for example a strong superconducting magnet with a field of 5T or more, preferably a field in the range 8–15T, cooling, administration and conventional in vivo MR signal generation.

Figure 1:
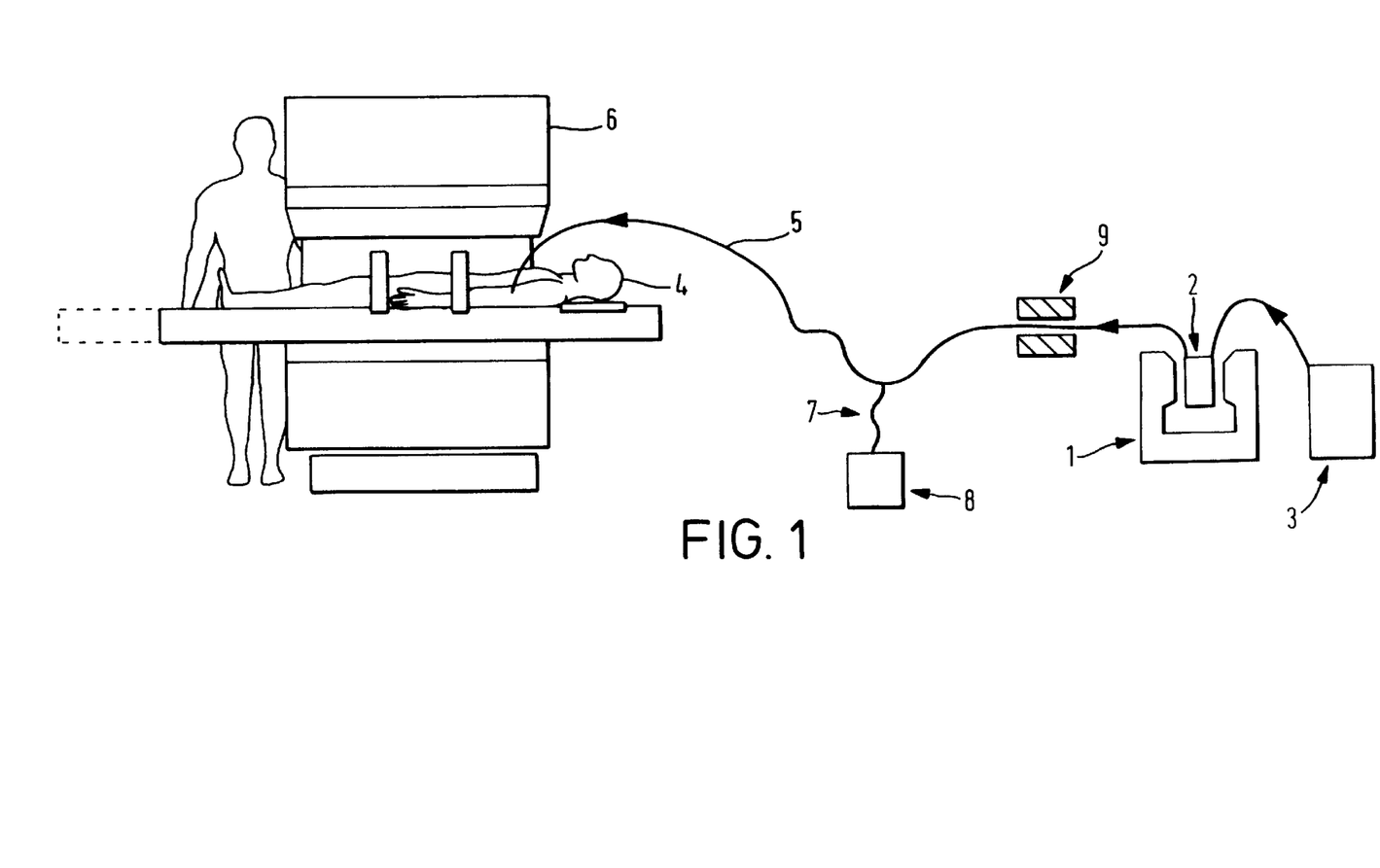

The method according to the invention may be conveniently carried out by using a first magnet for providing the polarising magnetic field and a second magnet for providing the primary magnetic field for MR imaging. An OMRI apparatus suitable for use in the present invention comprises a first magnet providing a magnetic field for dynamic nuclear polarisation and a second magnet providing the primary magnetic field for MR imaging of a subject (eg. an animate subject). FIG. 1 of the accompanying drawings is a schematic representation of one embodiment of the apparatus according to the invention. Therein a polarising magnet (which may be freestanding or the polarising and imaging magnets may be the same) (1) optionally together with a filter surrounds an EPR resonator (2) which provides the dynamic nuclear polarisation. A container (3) comprising a pump is provided for carrying the contrast composition which is delivered to a subject (4) by a delivery line (5). The container is also provided with means for heating the contrast composition. For the purposes of rapidly cooling the polarised MR imaging agent to physiological temperatures, a cold trap (9) is provided together with a container (8) and delivery line (7) for delivering for example cold saline solution (eg. Ringers Solution at −15° C.) or other physiologically acceptable media. The subject is situated within a conventional MR scanner (6).

Any conventional means may be used for the purposes of the heating step in the method according to the invention eg. infra-red or microwave means in conjunction with a conventional temperature controller. The optimum temperature will of course be dependent on the nature of the MR imaging agent and OMRI contrast agent and may be readily empirically determined. Preferably the temperature is about 40° C. or more, especially about 45° C. or more. Where the MR imaging agent is water, the optimum temperature will typically be in the range 45–95° C., preferably 60–95°.

The irradiation of the magnetic resonance of the OMRI agent is achieved by a resonator or antenna structure suitable for providing the appropriate resonant magnetic field. This is mainly perpendicular to the static field and of sufficient magnitude to approach saturation of the resonance in the whole sample volume, or at least the part of the sample which is injected into the subject. The irradiation of large volumes, preferably 10–100 ml, more preferably 50–100 ml or more, at high frequencies is a technical challenge. The appropriate construction may be a modification of resonators or antennas known in the field of magnetic resonance, for example cavity resonators, dielectric resonators, loop gaps and microstrip structures.

Figure 2:
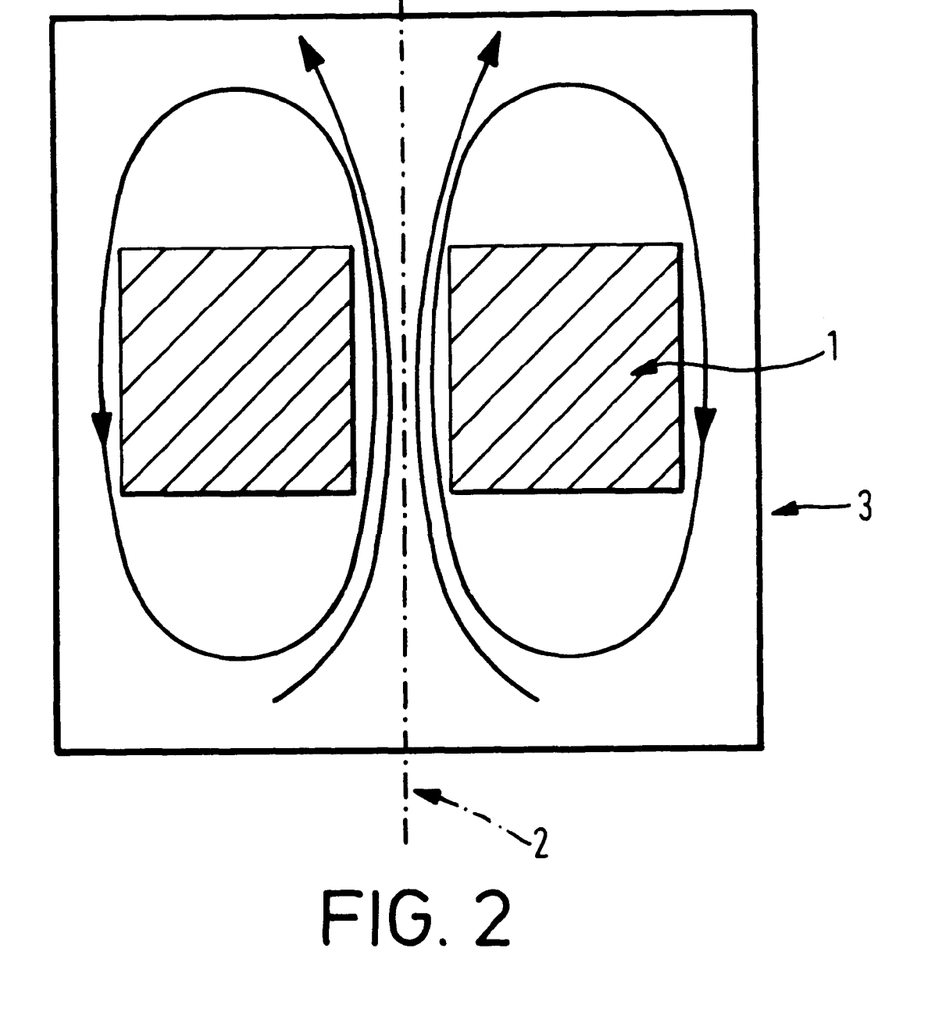

A dielectric resonator may be used in the dynamic nuclear polarisation process, typically to provide a field arrangement in which the magnetic field lines are shaped like a straw in a sheaf of corn with an electric field forming circles like the thread binding the sheaf. A field arrangement of this type may be formed by one of several rings or tubes of a material with a high dielectric constant and low loss. The man skilled in the art will appreciate that such a tube will exhibit different electromagnetic resonant modes. One of the dominant modes has the desired characteristic of electric field circulating around the tube axis within the wall and being zero at the axis and everywhere perpendicular to it. The magnetic field on the other hand is concentrated around the tube axis and mainly directed along it. The composition to be polarised is conveniently placed inside the resonator which is itself placed inside a metal box with a clearance typically of the order of the size of the resonator, and is excited to the desired resonance with a coupling loop or the like. The metal box ensures that the electromagnetic energy does not leak away by radiation. FIG. 2 of the accompanying drawings shows a dielectric resonator (1) (with an axis of rotational symmetry (2)) within a metal box (3).

An alternative embodiment to the dielectric resonator is a resonant cavity of which several are known to those skilled in the art. One simple and efficient resonant cavity is a metal box, such as a cylindrical metal box. A suitable mode is the one known as TM1,1,0 which produces a perpendicular magnetic field on the axis of the cavity. It is possible to excite two such modes in the same cavity at the same frequency producing fields which are mutually perpendicular. By arranging them to have a 90° phase difference a rotating field can be produced which is especially efficient for implementing dynamic polarisation with a minimum of dissipation in the sample. Modes with similar field distributions for different shapes of cavities e.g. rectangular cavities are familiar to those skilled in the art.

The composition may be dispersed into a plurality of compartments during the dynamic nuclear polarisation step. Thus the composition might be typically divided into parallel channels provided, for example, by parallel separating plates, discs or tubes, typically open-ended tubes. The electric losses (eddy currents) in the composition caused by the magnetic field are decreased by dividing the composition into smaller volumes using electrically isolating barriers, preferably situated perpendicular to the field. If the composition is in a cylindrical vessel surrounded by a dielectric resonator as described hereinbefore, the isolating barriers would be planes passing radially from the vessel axis to its wall. A simpler and more practical arrangement is to polarise the composition in a container which contains a plurality of thin-walled tubes of an isolating material such as quartz, glass or plastic. This has the advantage of reducing the electric losses in the composition which allows a larger volume of composition to be polarised for the same applied electromagnetic power. The walls, the inner, outer or both of the tubes may similarly serve as the substrate onto which the OMRI contrast agent is bound so that pressure applied to one end of the container by for example a plunger or pressure applicator may force the polarized, substantially OMRI contrast agent free, fluid MR imaging agent from the container, into a delivery line leading to the subject (patient) undergoing MR examination.

In a further embodiment, any known OMRI contrast agent capable of effecting a diagnostically effective contrast enhancement in the sample to which the MR imaging agent is administered may be used as an OMRI contrast agent in the present invention, provided that it is stable for a sufficient period of time at the elevated temperature at which it is desired to carry out polarisation. Where the OMRI contrast agent is a paramagnetic free radical, the radical may be conveniently prepared in situ from a stable radical precursor by a conventional physical or chemical radical generation step shortly before the method according to the invention is effected. This is particularly advantageous where the radical has a short half-life. In these cases, the radical will normally be non-reusable and may conveniently be discarded once the separation step of the method according to the invention has been completed.

Preferred OMRI contrast agents for use in the method according to the invention are those which can be conveniently and rapidly separated from the polarised MR imaging agent using known techniques as discussed below.

Preferably of course a chosen polarising agent will exhibit a long half-life (preferably at least one hour), long relaxation times ($T_{1e}$ and $T_{2e}$), high relaxivity and a small number of ESR transition lines. Thus the paramagnetic oxygen-based, sulphur-based or carbon-based organic free radicals or magnetic particles referred to in WO-A-88/10419, WO-A-90/00904, WO-A-91/12024, WO-A-93/02711 or WO-A-96/39367 would be suitable OMRI contrast agents for the present invention. A particularly preferred characteristic of a chosen OMRI contrast agent is that it exhibits low inherent ESR linewidths, preferably less than 500 mG, particularly preferably less than 400 mG, especially preferably less than 150 mG. Generally speaking, organic free radicals such as triarylmethyl and nitroxide radicals provide the most likely source of such desirably low linewidths eg. those described in WO-A-88/10419, WO-A-90/00904, WO-A-91/12024, WO-A-93/02711 or WO-A-96/39367.

Paramagnetic radical particles are also preferred for use in the present invention. Examples include "chars" particles conveniently dispersed in water and lithium phthalocyanine radical particles (see EP-A-467747). The definition of "char" as used herein refers to burned carbohydrates which are burnt at a temperature which is significantly lower than that used to produced graphite, typically 500° C.–800° C.

However, OMRI contrast agents useful in the present method are not limited to paramagnetic organic free radicals. Particles exhibiting the magnetic properties of superparamagnetism, ferromagnetism or ferrimagnetism may also be useful OMRI contrast agents, as may be other particles having associated free electrons. Superparamagnetic nanoparticles (eg. iron or iron oxide nanoparticles) may be particularly useful. Magnetic particles have the advantages over organic free radicals of high stability and a strong electronic/nuclear spin coupling (ie. high relaxivity) leading to greater Overhauser enhancement factors.

For ease of separation of the OMRI contrast agent and the MR imaging agent, it is particularly preferred that the combination of the two be a heterogeneous system, eg. a two phase liquid, a solid in liquid suspension or a relatively high surface area solid substrate within a liquid, eg. a solid in the form of beads fibres or sheets disposed within a liquid phase MR imaging agent. In all cases, the diffusion distance between the MR imaging agent and OMRI contrast agent must be small enough to achieve an effective Overhauser enhancement. Certain OMRI contrast agents are inherently particulate in nature, eg. the paramagnetic particles and superparamagnetic agents referred to above, others may be immobilized on, absorbed in or coupled to a solid substrate or support (eg. an organic polymer or inorganic matrix such as a zeolite) by conventional means. Strong covalent binding between OMRI contrast agent and solid substrate or support will, in general, limit the effectiveness of the agent in achieving the desired Overhauser effect and so it is preferred that the binding, if any, between the OMRI contrast agent and the solid support or substrate is weak so that the OMRI contrast agent is still capable of free rotation.

For in vivo imaging, the MR imaging agent used in the present method should have nuclei (eg. protons) capable of emitting magnetic resonance signals and should of course be physiologically tolerable or be provided in a physiologically tolerable form. Besides protons, other physiologically tolerable MR imaging nuclei may of course be used, eg, $^{19}F$, $^{13}C$, $^{31}P$ and sodium. Preferred MR imaging agents according to the invention exhibit the properties of inter alia high stability to oxygen, to pH (eg. in the pH range 5–9), to physiological temperatures and are stable in body fluids. They are of course non-toxic and preferably are rapidly excreted.

Conveniently, the MR imaging agent once polarised will remain so for a period sufficiently long to allow the imaging procedure to be comfortably carried out. Preferably, significant polarisation will be retained for at least 10s, more preferably at least 100s. In one embodiment of the method of the invention, the polarised MR imaging agent may be stored in frozen form. At low temperatures the polarisation is retained longer and thus the polarised MR imaging agent may be conveniently stored eg. in liquid nitrogen. Prior to use, it may be rapidly warmed to physiological temperatures using conventional techniques such as infrared or microwave radiation.

Particularly preferred MR imaging agents are physiologically tolerable aqueous solutions (eg. saline) in which protons are the imaging nuclei of interest. However water itself is especially preferred and has the advantage of being physiologically tolerable and may be administered to the subject free from carriers, excipients or formulation aids.

With water as the MR imaging agent, the OMRI contrast agent may be chosen to be water soluble (eg. typically the water soluble free radicals described in WO-A-93/02711), or capable of being dispersed in water or suspended in water to produce the desired composition for use in the method according to the invention. The composition may be conveniently stored in this "ready to use" form prior to use.

It will be appreciated that a heated, polarised MR imaging agent must be rapidly quenched to physiological temperatures prior to administration. Thus means for imposing any elevated pressure and temperature on the mixture should be removed at the earliest possible opportunity. Further rapid cooling is possible by adding, for example, cold saturated salt solutions (eg. Ringers Solution at −15° C.) or other cooling agents which conveniently serve to provide a medium in which the MR imaging agent may be administered. Yet further cooling is possible by, for example, contacting the MR imaging agent with a cold surface (eg. a cold trap) prior to administration. Administration should occur in a fraction of the time $T_1$ of the MR imaging agent and should typically be within 3s of the temperature drop. It will be appreciated that in this sense the increased relaxation time $T_1$ provided by the invention is an important improvement in the ex vivo method.

Viewed from a further aspect the present invention provides a physiologically tolerable MR imaging agent comprising water at a temperature of 45° C. or more, preferably in the range 45–95° C., and having an effective nuclear polarisation of 10T or more, preferably 30T or more, especially 50T or more.

Viewed from a yet further aspect the present invention provides the use of a physiologically tolerable aqueous solution (eg. a saturated saline solution such as Ringer's Solution) as a cooling agent for the preparation of a MR contrast medium. Preferably, the MR contrast medium comprises polarised water.

Viewed from a yet still further aspect the present invention provides a method of generating an image of an animate subject comprising ex vivo polarisation of an MR imaging agent, characterised in that the MR imaging agent, preferably together with an OMRI contrast agent, is heated during polarisation or is at elevated temperature at the time of polarisation, and wherein an image of at least part of said subject is generated.

Viewed from a yet still further aspect the present invention provides the use of an MR imaging agent as hereinbefore described for the preparation of a contrast medium for use in methods of diagnosis involving MR investigation of an animate subject.

The method according to the invention has the benefit of being able to provide significant spatial weighting to a generated image. In effect, the administration of a polarised MR imaging agent to a selected region of a sample (eg. by injection) means that the contrast effect is, in general, localised to that region. This of course depends on the extent of biodistribution over the period in which the MR imaging agent remains significantly polarised. In general, specific body volumes (i.e. regions of interest) may be defined with improved signal to noise properties of the resulting images in these volumes.

In one embodiment, a "native image" of the sample (e.g. body) (ie. one obtained prior to administration of the MR imaging agent or one obtained for the administered MR imaging agent without prior Overhauser enhancement as in a conventional MR experiment) may be generated to provide structural (eg. anatomical) information upon which the image obtained in the method according to the invention may be superimposed. This is a particularly useful aspect of the present method given that the polarisation of the MR imaging agent may only last for a short period and so biodistribution within the timescale of the measurement may be limited.

Given that the method of the invention should be carried out within the time that the MR imaging agent remains significantly polarised, once separation has been achieved it is desirable for administration of the MR imaging agent to be effected rapidly and for the MR measurement to follow shortly thereafter. This means that the sample (eg. body or organ) should be available close to the area in which the polarisation has been carried out. The preferred administration route for the MR imaging agent is by injection (eg. bolus injection) or where the lungs are to be imaged by spray, eg. aerosol spray.

The separation step of the method of the invention is intended to remove substantially the whole of the OMRI contrast agent from the composition (or at least to reduce it to physiologically tolerable levels) as rapidly as possible. Many physical and chemical separation or extraction techniques are known in the art and may be employed to effect rapid and efficient separation of the OMRI contrast agent and MR imaging agent. Clearly the more preferred separation techniques are those which can be effected rapidly and particularly those which allow separation in less than one second. In this respect, magnetic particles (eg. superparamagnetic particles) may be advantageously used as the OMRI contrast agent as it will be possible to make use of the inherent magnetic properties of the particles to achieve rapid separation by known techniques. Similarly, where the OMRI contrast agent is a solid bound to a magnetic bead, it may be conveniently separated from the liquid by an appropriately applied magnetic field.

Where the combination of an OMRI contrast agent and MR imaging is a heterogeneous system, it will be possible to use the different physical properties of the phases to carry out separation by conventional techniques. For example, where one phase is aqueous and the other non-aqueous (solid or liquid) it may be possible to simply decant one phase from the other. Alternatively, where the OMRI contrast agent is a solid or solid substrate (eg. a bead) suspended in a liquid MR imaging agent the solid may be separated from the liquid by conventional means eg. filtration, gravimetric, chromatographic or centrifugal means. The OMRI agents in solid form may be lyophilised.

It is also envisaged that the OMRI contrast agents may comprise lipophilic moieties and so be separated from the MR imaging agent by passage over or through a fixed lipophilic medium or the OMRI contrast agent may be chemically bound to a lipophilic solid bead.

One separation technique makes use of a cation exchange polymer and a cationic OMRI contrast agent, eg. a trityl carrying pendent carboxylate groups. Alternatively, acidifying the solution to around pH 4 may cause the OMRI contrast agent to precipitate out. Separation may then be carried out for example by filtration followed by neutralisation. An alternative technique involves adding ions which causes precipitation of ionic OMRI agents which may then be filtered off.

Certain OMRI contrast agents, such as the trityl agents, may have an affinity for proteins. Thus, after polarisation, a composition containing an OMRI contrast agent with a protein affinity may be passed through or over a protein in a form which exposes a large surface area to the agent eg. in particulate or surface bound form. In this way, binding of the OMRI contrast agent to the protein enables it to be removed from the composition.

The OMRI contrast agent will always have a molecular weight larger than that of water and therefore, in general, normal filtering techniques can be used for separating molecules with buffered molecules, ie. hollow fibres.

The MR imaging agents may be conveniently formulated with conventional pharmaceutical or veterinary carriers or excipients. MR imaging agent formulations manufactured or used according to this invention may contain, besides the MR imaging agent, formulation aids such as are conventional for therapeutic and diagnostic compositions in human or veterinary medicine. Thus the formulation may for example include stabilizers, antioxidants, osmolality adjusting agents, solubilizing agents, emulsifiers, viscosity enhancers, buffers, etc. Preferably none of such formulation aids will be paramagnetic, superparamagnetic, ferromagnetic or ferrimagnetic. The formulation may be in forms suitable for parenteral (eg. intravenous or intraarterial) or enteral (eg. oral or rectal) application, for example for application directly into body cavities having external voidance ducts (such as the lungs, the gastrointestinal tract, the bladder and the uterus), or for injection or infusion into the cardiovascular system. However solutions, suspensions and dispersions in physiological tolerable carriers eg. water will generally be preferred.

For use in in vivo imaging, the formulation, which preferably will be substantially isotonic, may conveniently be administered at a concentration sufficient to yield a 1 micromolar to 10 mM concentration of the MR imaging agent (or even higher where the MR imaging agent is water) agent is in the imaging zone; however the precise concentration and dosage will of course depend upon a range of factors such as toxicity, the organ targeting ability of the MR imaging agent, and the administration route. The optimum concentration for the MR imaging agent represents a balance between various factors. In general, optimum concentrations would in most cases lie in the range 0.1M to 10M (or even higher where the MR imaging agent is water), especially 0.2 to 8M, more especially 0.5 to 5M. Formulations for intravenous or intraarterial administration would preferably contain the MR imaging agent in concentrations of 0.1 to 10M (or when the MR imaging agent is water up to 56M), especially 0.5 to 5M. For bolus injection the concentration may conveniently be 0.1M to 10M (or up to 56M when the MR imaging agent is water), preferably 0.2M to 8M, more preferably 0.5M to 5M.

Parenterally administrable forms should of course be sterile and free from physiologically unacceptable agents, and should have low osmolality to minimize irritation or other adverse effects upon administration and thus the formulation should preferably be isotonic or slightly hypertonic. Suitable vehicles include aqueous vehicles customarily used for administering parenteral solutions such as Sodium Chloride solution, Ringer's solution, Dextrose solution, Dextrose and Sodium Chloride solution, Lactated Ringer's solution and other solutions such as are described in Remington's Pharmaceutical Sciences, 15th ed., Easton: Mack Publishing Co., pp. 1405–1412 and 1461–1487 (1975) and The National Formulary XIV, 14th ed. Washington: American Pharmaceutical Association (1975). As has been previously described, cold saturated salt solutions may serve to cool the MR imaging agent prior to administration and are therefore preferred vehicles in the parenteral solutions, typically at a concentration of about 0.15M. The compositions can contain preservatives, antimicrobial agents, buffers and antioxidants conventionally used for parenteral solutions, excipients and other additives which are compatible with the MR imaging agents and which will not interfere with the manufacture, storage or use of the products.

Where the MR imaging agent is to be injected, it may be convenient to inject simultaneously at a series of administration sites such that a greater proportion of the vascular tree may be visualized before the polarization is lost through relaxation.

The dosages of the MR imaging agent used according to the method of the present invention will vary according to the precise nature of the MR imaging agents used, of the tissue or organ of interest and of the measuring apparatus. Preferably the dosage should be kept as low as possible while still achieving a detectable contrast effect. In general, the maximum dosage will depend on toxicity constraints.

In the following Example, the effect of temperature on the DNP enhancement and magnetisation of an ex vivo polarised water bolus is demonstrated. The agent responsible for the dynamic nuclear polarisation was a triarylmethyl free radical ("symmetric trityl") dissolved in water.

The dynamic nuclear polarisation enhanced magnetisation at a certain proton Larmor frequency is represented as the equivalent thermal equilibrium magnetic field according to the formula:

$$B_{DNP} = Enh \times f / 42.6 \text{ Mhz}$$

where f is the proton Larmor frequency.

Diffusion and proton longitudinal relaxation in water may be found in J. H. Simpson et al., Phys. Rev. 111 1201–1202 (1958). Selected values are given in Table I and are field independent.

TABLE I

| | Simpson et al. | |
|---|---|---|
| Temperature | Diffusion constant $D \times 10^5$ cm$^2$/s | $T_1$ sec |
| 303K | 2.46 | 3.82 |
| 313K | 3.14 | 4.76 |
| 323K | 3.94 | 5.77 |
| 333K | 4.82 | 6.81 |
| 343K | 5.78 | 7.91 |

EXAMPLE 1

Figure 3:
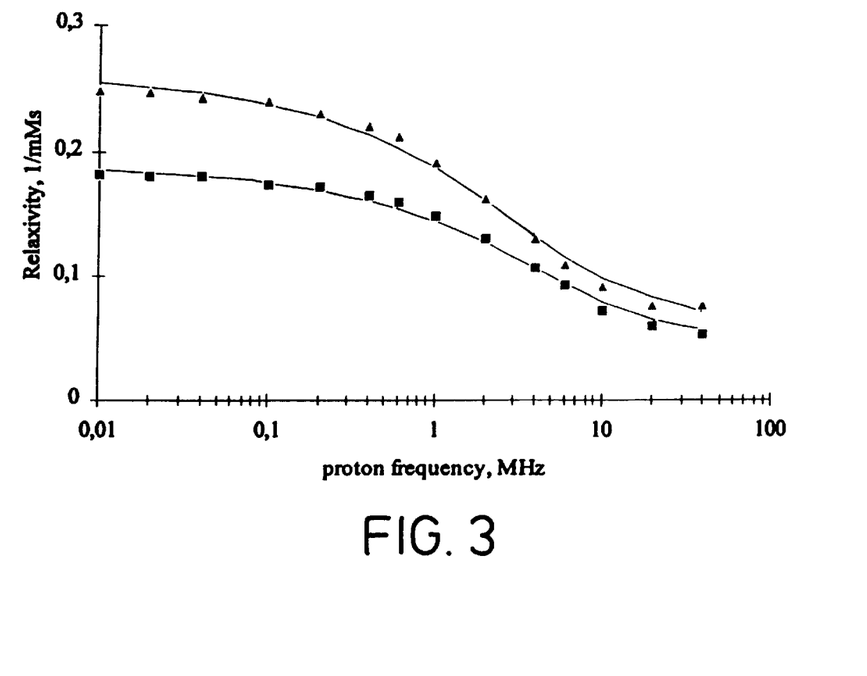

The relaxivity of the symmetric trityl was measured on a field cycling relaxometer. The data is shown in FIG. 3. The two data series at 23° C. and 37° C. were fitted to equation 5 and the best fit parameters found to be d=5.45Å and D=$D_I$+$D_S$ equal to 156 ps and 110 ps. Correlation times at other temperatures were found by scaling the two experimental values according to Table I for the water diffusion constant.

Figure 4:
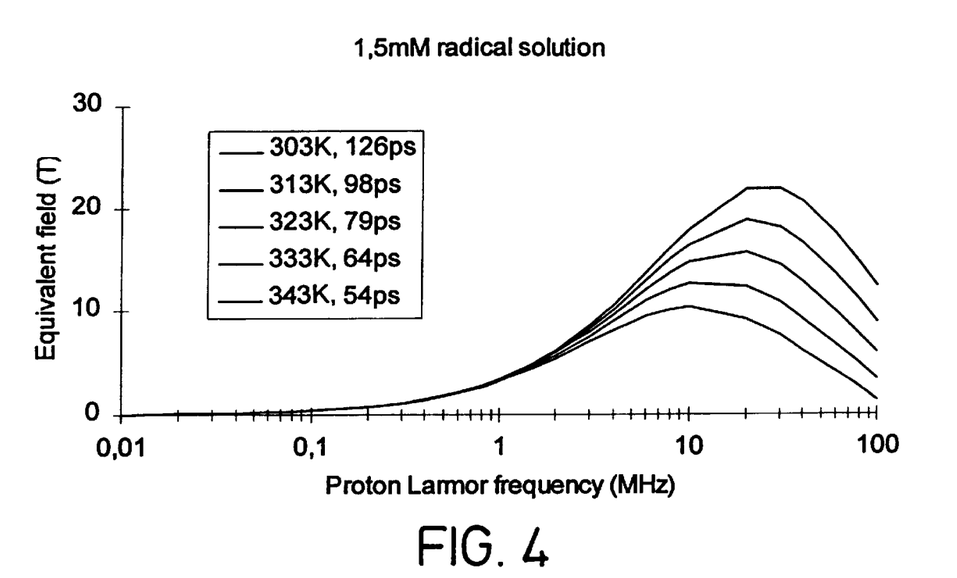
Figure 5:
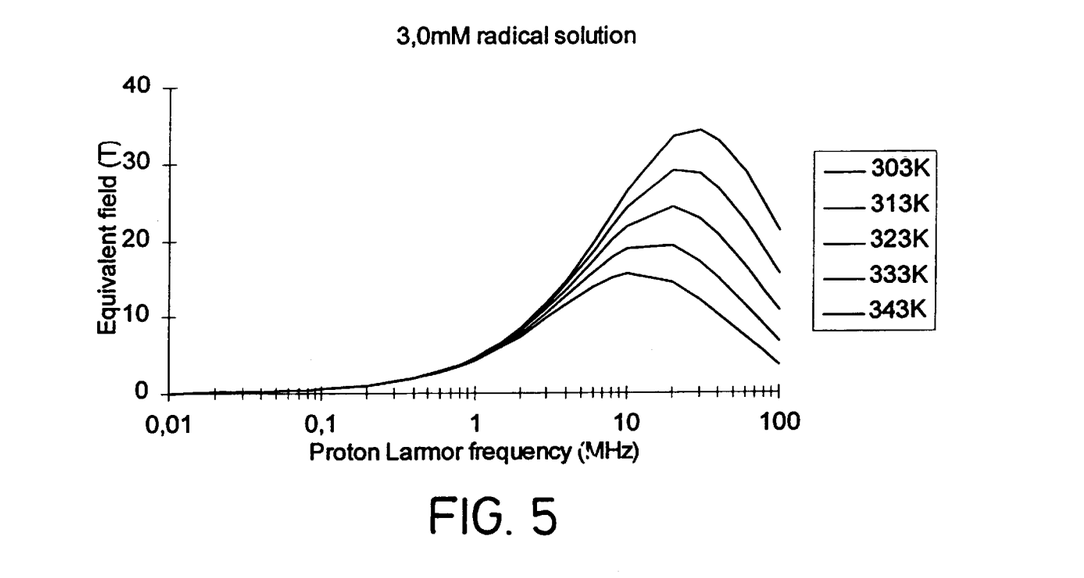
Figure 6:
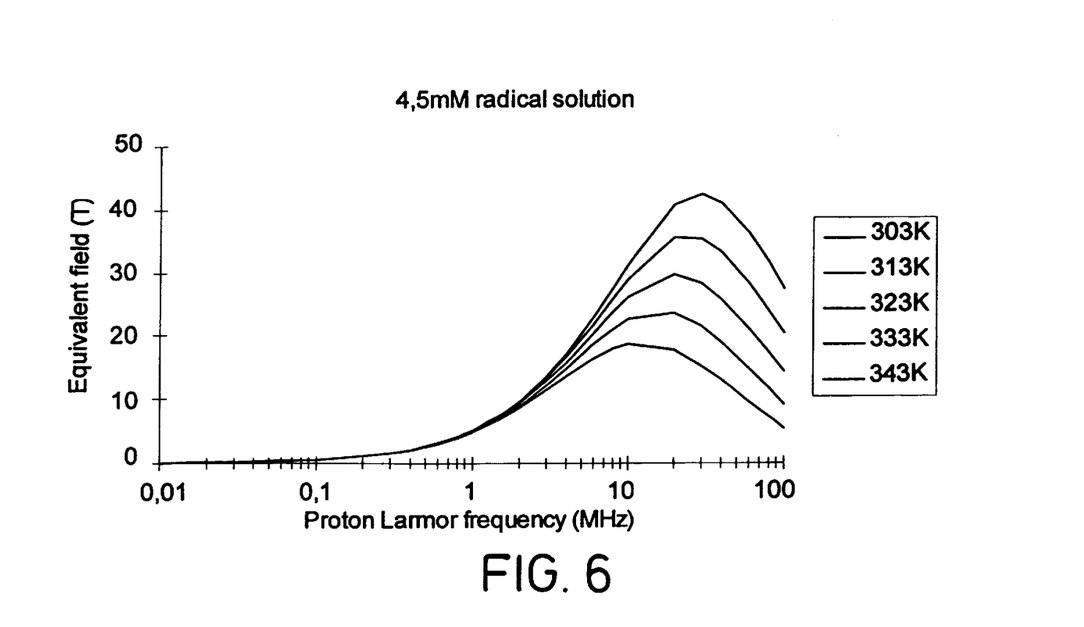

FIGS. 4, 5 and 6 are simulations of equations 3 and 7. Full saturation (SAT=1) of the electron spin resonance is assumed for any concentration and resonance frequency. The correlation time for each temperature is given only in FIG. 4 and is found by scaling the experimental correlation times of FIG. 3 with the relative changes in water diffusion constant. FIGS. 4, 5 and 6 illustrate that the maximum magnetisation is obtained between 10 and 20 MHz proton Larmor frequency and shifts to higher frequencies as the temperature is increased. At low frequencies, the product of $r_1$ and $T_{10}$ in equation 4 is only weakly dependent on temperature. Thus the effect of increasing the temperature is mainly to shift the dispersion point of the coupling factor to a higher frequency. However, close to and above the dispersion point of the coupling factor, increasing the temperature also has a positive effect on the leakage factor.

What is claimed is:

1. A method of magnetic resonance investigation of an animate subject comprising ex vivo polarisation of an MR imaging agent, characterised in that the MR imaging agent is heated during polarisation or is at elevated temperature at the time of polarisation.

2. A method as claimed in claim 1 wherein an OMRI contrast agent is heated together with the MR imaging agent.

3. A method as claimed in claim 2 comprising the following steps:
  i) placing a composition comprising an OMRI contrast agent and an MR imaging agent in a uniform magnetic field;
  ii) exposing said composition to a first radiation of a frequency selected to excite electron spin transitions in said OMRI contrast agent;
  iii) separating at least a portion of said OMRI contrast agent from said MR imaging agent;
  iv) cooling said MR imaging agent;
  v) administering said MR imaging agent to said sample;
  vi) exposing said sample to a second radiation of a frequency selected to excite nuclear spin transitions in MR imaging nuclei of said MR imaging agent; and
  vii) detecting magnetic resonance signals from said sample.

4. A method as claimed in claim 3 further comprising the final step of generating an image or dynamic flow data from said detected signals.

5. A method as claimed in claim 3 further comprising the step of heating said composition between steps i) and ii).

6. A method as claimed in claim 5 wherein said composition is heated to a temperature of 40° C. or more.

7. A method as claimed in claim 6 wherein said composition is heated to a temperature of 45° C. or more.

8. A method as claimed in claim 1 wherein said MR imaging agent is an agent containing non-zero nuclear spin nuclei.

9. A method as claimed in claim 8 wherein said nuclei are protons.

10. A method as claimed in claim 9 wherein said nuclei are heated to a temperature in the range 45–95° C.

11. A method as claimed in claim 10 wherein said nuclei are heated to a temperature in the range 60–95° C.

12. A method as claimed in claim 1 wherein said ex vivo polarisation is achieved by imposing a magnetic field higher than $B_0$ which is the primary magnetic field.

13. A method as claimed in claim 12 wherein said magnetic field is 5T or more.

14. A method as claimed in claim 13 wherein said magnetic field is in the range 8–15T.

15. A method of generating an image of an animate subject comprising ex vivo polarisation of an MR imaging agent, characterised in that the MR imaging agent is heated during polarisation or is at elevated temperature at the time of polarisation, and wherein an image of at least part of said subject is generated.

16. A method as claimed in claim 15 wherein an OMRI contrast agent is heated together with the MR imaging agent.

* * * * *